United States Patent
Gandhi et al.

(10) Patent No.: US 11,282,776 B2
(45) Date of Patent: Mar. 22, 2022

(54) HIGH DENSITY ROUTING FOR HETEROGENEOUS PACKAGE INTEGRATION

(71) Applicant: Xilinx, Inc., San Jose, CA (US)

(72) Inventors: Jaspreet Singh Gandhi, San Jose, CA (US); Vadim Heyfitch, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/902,949

(22) Filed: Feb. 22, 2018

(65) Prior Publication Data

US 2019/0259695 A1 Aug. 22, 2019

(51) Int. Cl.
| | |
|---|---|
| H01L 21/48 | (2006.01) |
| H01L 23/498 | (2006.01) |
| G01R 31/317 | (2006.01) |
| H01L 23/00 | (2006.01) |
| H01L 25/065 | (2006.01) |
| H01L 23/31 | (2006.01) |
| H01L 23/64 | (2006.01) |
| H01L 21/56 | (2006.01) |

(52) U.S. Cl.
CPC .. *H01L 23/49827* (2013.01); *G01R 31/31717* (2013.01); *H01L 21/486* (2013.01); *H01L 21/4857* (2013.01); *H01L 21/568* (2013.01); *H01L 23/3128* (2013.01); *H01L 23/49822* (2013.01); *H01L 23/642* (2013.01); *H01L 24/03* (2013.01); *H01L 24/16* (2013.01); *H01L 25/0657* (2013.01); *H01L 24/13* (2013.01); *H01L 24/14* (2013.01); *H01L 2224/13025* (2013.01); *H01L 2224/13101* (2013.01); *H01L 2224/14133* (2013.01); *H01L 2224/14181* (2013.01); *H01L 2224/16145* (2013.01); *H01L 2224/16225* (2013.01); *H01L 2924/1431* (2013.01); *H01L 2924/1434* (2013.01); *H01L 2924/15192* (2013.01); *H01L 2924/18161* (2013.01)

(58) Field of Classification Search
CPC .............. H01L 23/49827; G01R 31/31717
See application file for complete search history.

(56) References Cited

U.S. PATENT DOCUMENTS

| | | |
|---|---|---|
| 6,875,921 B1 | 4/2005 | Conn |
| 7,233,061 B1 | 6/2007 | Conn |
| 7,566,960 B1 | 7/2009 | Conn |
| 8,062,968 B1 | 11/2011 | Conn |
| 8,519,528 B1 | 8/2013 | Nagarajan et al. |
| 8,704,364 B2 | 4/2014 | Banijamali |
| 8,704,384 B2 | 4/2014 | Wu et al. |
| 8,779,553 B2 | 7/2014 | Rahman |
| 8,823,133 B2 | 9/2014 | Jenkins et al. |
| 8,841,752 B1 | 9/2014 | Chaware et al. |
| 8,869,088 B1 | 10/2014 | Camarota |
| 8,890,562 B1 | 11/2014 | Hartanto |

(Continued)

*Primary Examiner* — Sarah K Salerno
(74) *Attorney, Agent, or Firm* — Patterson + Sheridan, LLP

(57) ABSTRACT

A chip package and method of fabricating the same are described herein. The chip package includes a high speed data transmission line that has an inter-die region through which a signal transmission line couples a first die to a second die. The signal transmission line has a resistance greater than an equivalent base resistance (EBR) of a copper line, which reduces oscillation within the transmission line.

17 Claims, 8 Drawing Sheets

(56) References Cited

U.S. PATENT DOCUMENTS

| | | |
|---|---|---|
| 8,900,987 B1 | 12/2014 | Singh et al. |
| 8,946,884 B2 | 2/2015 | Kwon et al. |
| 9,000,490 B2 | 4/2015 | Vo et al. |
| 9,026,872 B2 | 5/2015 | Camarota |
| 9,128,148 B2 | 9/2015 | Lowney et al. |
| 9,224,697 B1 | 12/2015 | Kwon et al. |
| 9,245,852 B2 * | 1/2016 | Chen .................... H01L 23/552 |
| 9,330,823 B1 | 5/2016 | Rahman et al. |
| 9,337,138 B1 | 5/2016 | Abugharbieh et al. |
| 2009/0206455 A1 * | 8/2009 | Harper ................. H01L 25/105 257/659 |
| 2009/0218698 A1 * | 9/2009 | Lam ...................... H01L 24/85 257/773 |
| 2010/0072588 A1 * | 3/2010 | Yang ................... H01L 23/5384 257/676 |
| 2010/0140779 A1 * | 6/2010 | Lin ..................... H01L 23/5389 257/690 |
| 2011/0088925 A1 * | 4/2011 | Tatsumi ................ H01B 17/36 174/69 |
| 2011/0285023 A1 * | 11/2011 | Shen ...................... H01L 24/14 257/773 |
| 2012/0106117 A1 * | 5/2012 | Sundaram ......... H01L 23/49827 361/808 |
| 2012/0147567 A1 * | 6/2012 | Lee ........................ H01L 25/18 361/729 |
| 2013/0168860 A1 * | 7/2013 | Karikalan ............ H01L 23/538 257/741 |
| 2014/0021583 A1 * | 1/2014 | Lo ..................... H01L 23/49816 257/532 |
| 2014/0110832 A1 * | 4/2014 | Crisp .................. H01L 25/0652 257/696 |
| 2015/0022985 A1 * | 1/2015 | Na .......................... H01L 23/50 361/763 |
| 2015/0084206 A1 * | 3/2015 | Lin ..................... H01L 23/5389 257/774 |
| 2015/0206865 A1 | 7/2015 | Yu et al. |
| 2015/0348940 A1 * | 12/2015 | Woychik ................ H01L 24/14 257/774 |
| 2016/0084887 A1 * | 3/2016 | Beer .................. G01R 19/0092 324/126 |
| 2017/0373037 A1 | 12/2017 | Yu et al. |

* cited by examiner

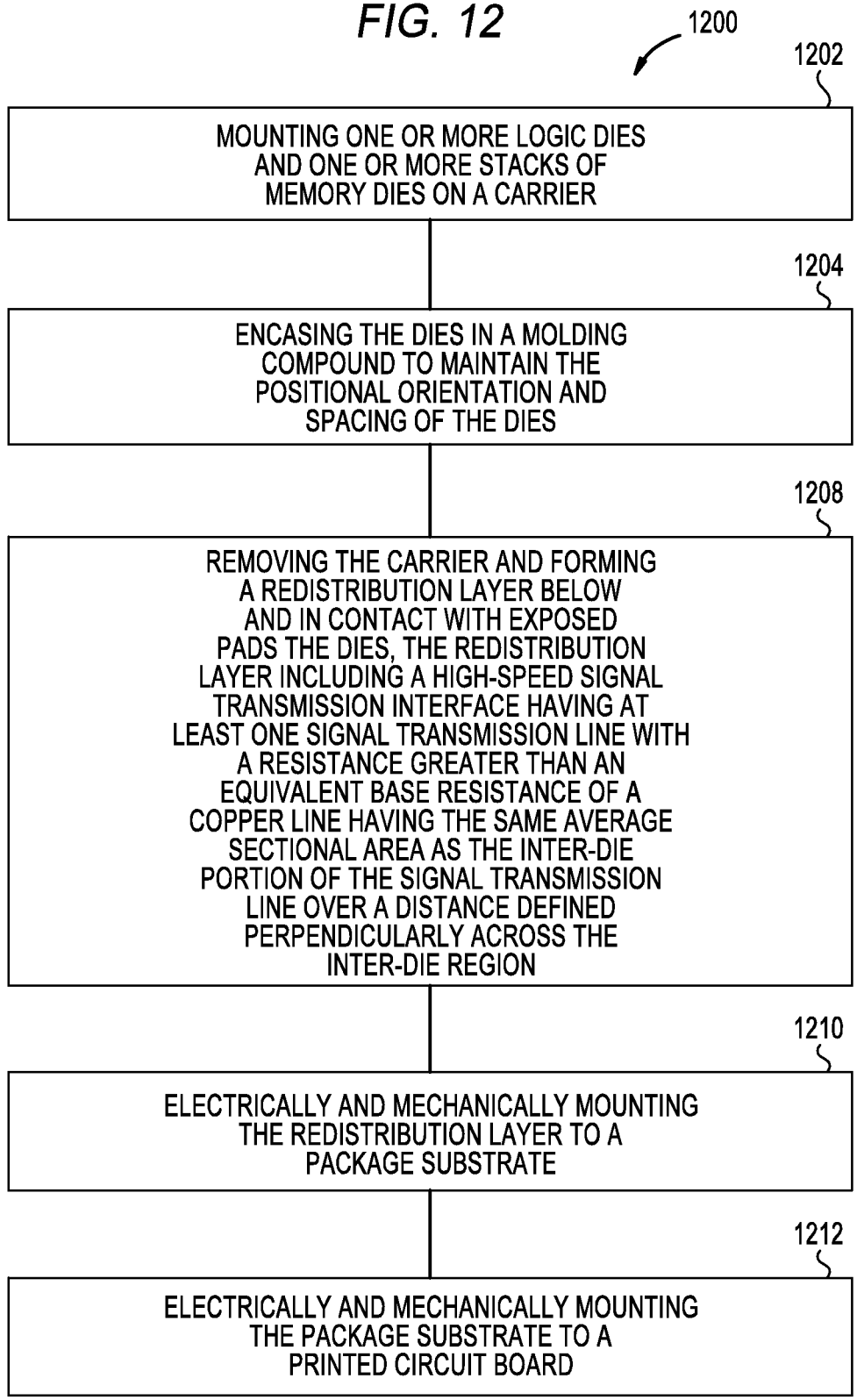

HIGH DENSITY ROUTING FOR HETEROGENEOUS PACKAGE INTEGRATION

TECHNICAL FIELD

Embodiments of the present disclosure generally relate to chip packages and electronic devices having the same. In particular, to a high speed inter-die connection interface formed in a thin organic redistribution layer disposed between components of a chip package and electronic device that provide high speed data signal communication between the components.

BACKGROUND ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

Silicon Interposers having silicon substrates are particularly advantageous for forming high speed interconnections between IC dies within the package due to the fine conductor size and pitches that can be fabricated using well known and reliable semiconductor fabrication techniques. However, some packages have replaced silicon interposers with chip interconnections formed in a silicon substrate-less redistribution layer. Conventional redistribution layers are generally fabricated from stacked organic dielectric material layers that separate copper lines that form the interconnections. However, conventional redistribution layer fabrication techniques cannot achieve the fine line widths and small line pitches beneficially obtained when using a silicon interposer. As a result, high speed interconnections between IC dies formed in a thin organic redistribution layer often are subject to undesirable oscillation and crosstalk contrary to silicon interposers where material losses are significantly higher.

Therefore, a need exists for a chip package having an improved redistribution layer that provides a high speed inter-die connection interface between dies of the chip package for improved data transmission performance as compared what is conventionally available in the art.

SUMMARY

Embodiments of the disclosure generally provide chip packages and methods of fabricating the same. The chip package has improved high speed data transmission performance compared to conventional packages having thin organic interposers, and is particularly useful when co-packaging logic and (high-bandwidth) memory dies into a memory device.

In one example, a chip package is provided that includes a first die, a second die, a package substrate, and a redistribution layer (RDL) mounted on the package substrate. The RDL has a signal transmission interface connecting the first die with the second die. The signal transmission interface including a signal transmission line having an inter-die portion. The signal transmission line has a resistance greater than an equivalent base resistance of a copper line.

In another example, chip package is provided that a logic die, a stack of memory dies, a package substrate, an inter-die region defined between the logic die and the stack of memory dies, and a redistribution layer (RDL) mounted on the package substrate. The inter-die region includes a first region that extends between the logic and memory dies adjacent signal transmission pads formed at a side of the logic die. The inter-die region includes a second region that extends between the logic and memory dies adjacent ground or power pads formed at the side of the logic die. The RDL has a signal transmission interface connecting the logic die with the stack of memory dies across the inter-die region. The interface includes a first signal transmission line having an inter-die portion. The first signal transmission line has a resistance greater than an equivalent base resistance of a copper line. The first signal transmission line is disposed at least partially within the second region.

In yet another example, a method for forming a chip package is provided. The method includes mounting one or more logic dies and one or more stacks of memory dies on a carrier; encasing the dies in a molding compound to maintain a positional orientation and spacing of the memory and logic dies; removing the carrier and forming a redistribution layer below and in contact with exposed pads the dies, the redistribution layer including a high-speed signal transmission interface having at least one signal transmission line with a resistance greater than an equivalent base resistance of a copper line having the same average sectional area and length as the signal transmission line, the copper line having an inter-die portion defined perpendicularly across an inter-die region defined between the one or more logic dies and the one or more stacks of memory dies; and electrically and mechanically mounting the redistribution layer to a package substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 12 is a flow diagram of a method of fabricating a chip package.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 1:
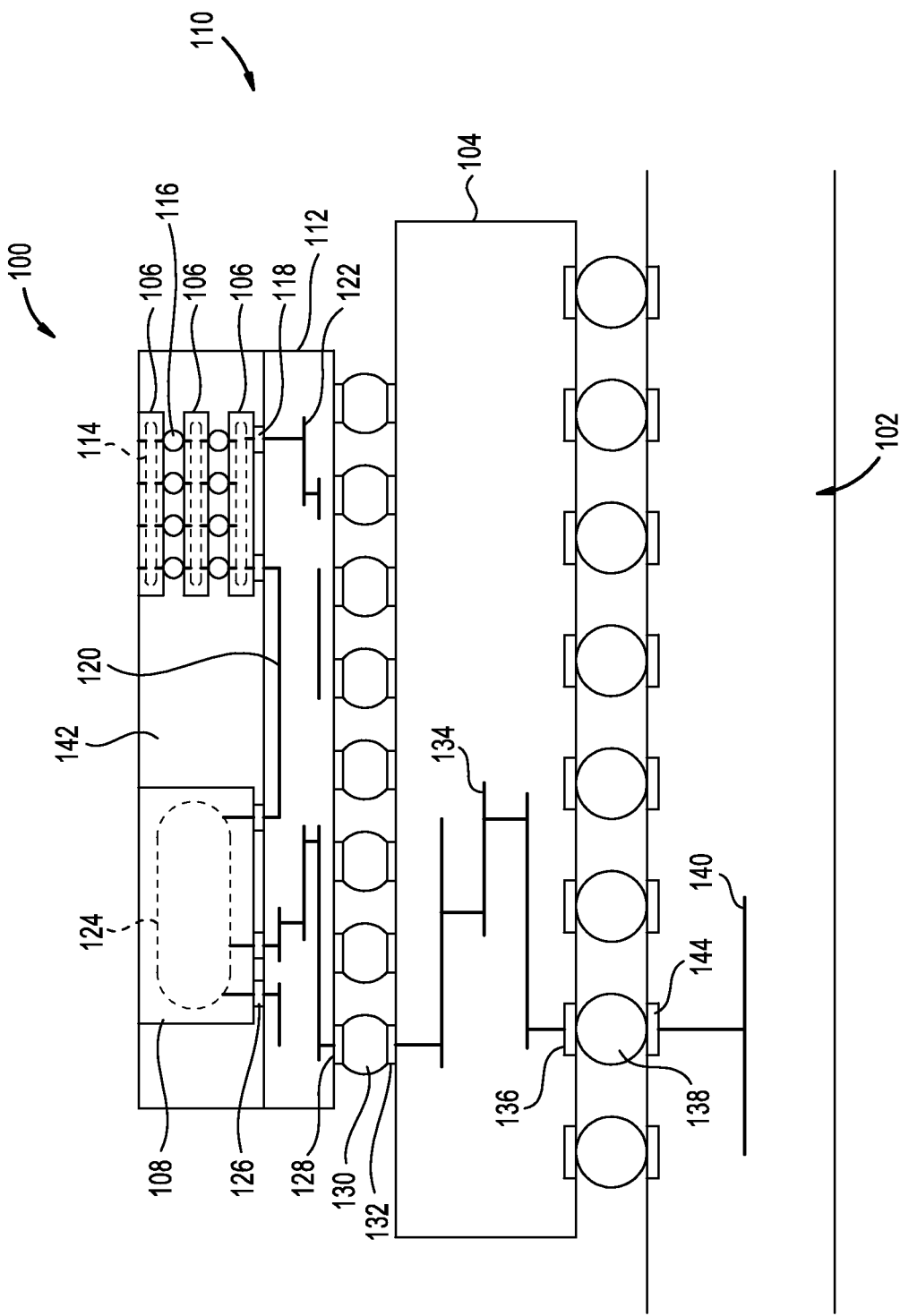
FIG. 1 is a cross sectional schematic view of an integrated circuit chip package mounted on a printed circuit board.

Embodiments of the disclosure generally provide chip packages and methods of fabricating chip packages. The chip package has improved high speed data transmission performance compared to conventional packages having thin organic interposers. The chip package includes a redistribution layer having a high speed inter-die connection interface. Lines of the inter-die connection interface are configured to dampen oscillations which undesirably cause noise and poor functionality. In some examples, the lines of the inter-die connection interface are spaced further apart as compared to conventional interfaces, thus advantageously reducing the potential for crosstalk. The above improvements are particularly useful in chip packages that integrate a first die with a second die across a short distance, such as in applications having one or more HBM (high bandwidth memory) dies communicating with one or more logic dies, such as a field programmable gate array (FPGA) die, within a single package.

For example, silicon-based interposers (i.e., interposers built on silicon substrates) have been conventionally used in chip packages having HBM interfaces, utilizing mature TSV (through silicon via) technology. In many next generation applications, silicon-based interposers are being replaced in HBM interfaces with a redistribution layer that does not include a silicon substrate mainly to take advantage of reduced fabrication costs. While the die to die interface on a silicon interposer helps achieve low latency between logic and memory dies, which is critical to memory performance, high routing density is required to accommodate a large number of signal IOs within a limited space and number of layers. For example, in some applications, about 1700 signal transmission lines have to escape from each die in a 6 mm-wide space on two or three signal layers.

In a conventional redistribution layer, manufacturing constraints of the cross sectional dimensions, such as the trace width and copper line thickness, the gap between lines, the dielectric layer thickness, the need for perforation in reference ground plane (if used), are dictated by redistribution layer fabrication process used to implement interface. In combination, the above characteristics often result in unique crosstalk behavior that causes a conventional redistribution layer to underperform silicon interposers.

Specific to the conventional redistribution layer, the short signal line length, in combination with the driver complex-valued output impedance and the capacitive input of the receiver, creates a LCR tank, an under-dampened LC-tank resonators, with natural frequency of oscillation around 3-4 GHz. Even a weak crosstalk excitation from an adjacent aggressor signals causes a quiet victim signal undergo resonant oscillation, or ringing. The coupling between adjacent signals within the breakout area is severe enough to reduce noise margins to zero. The resistive loss in signal lines must be sufficient to dampen this ringing. Conventional copper lines that route perpendicularly between facing dies generally do not have enough resistance to dampen the ringing. Therefore, simply connecting logic and memory dies with the straight connection lines, limited only by DFM mechanical constraints, would result in a bus that cannot operate at the target data rate. Examples of the disclosure are described below that mitigate the aforementioned undesirable oscillations, and in some examples, also beneficially reduce crosstalk between signal lines.

Turning now to FIG. 1, an integrated circuit electronic device 110 is schematically illustrated having an exemplary integrated circuit chip package 100 mounted on a printed circuit board (PCB) 102. The chip package 100 includes a package substrate 104 upon which one or more first dies 106 and one or more second dies 108 are mounted. A molding compound 142 is disposed around the dies 106, 108 to maintain the positional orientation and spacing of the dies 106, 108.

At least one of the first dies 106 communicates with at least one or more of the second dies 108 through one or more high speed interfaces 120 defined in a redistribution layer (RDL) 112 disposed between the dies 106, 108 and the package substrate 104. The RDL 112 is comprised of dielectric layers that separate conductive signal transmission lines, as further described below.

Although examples are further described below with the first die 106 configured as a memory die and the second die 108 configured as a logic die, the interface 120 and other interfaces described herein may be utilized between any to dies connected though a redistribution layer to take benefit of reduced oscillation and reduced crosstalk between conductive signal transmission lines comprising the interface. Accordingly hereinafter, first die is referred to the memory die 106 while the second die is referred to as the logic die 108.

The memory dies 106 are configured as a high-performance solid state memory device, such as DRAM, among others. In the embodiment depicted in FIG. 1, although 3 memory dies 106 are illustrated in a single stack, the stack of memory dies 106 may include different numbers of dies 106, and the package 100 may include more or more stacks of memory dies 106. In some example, the number of memory dies 106 in a stack may be 2, 4, 8, 16 or other desired amount. The logic dies 108 may be programmable logic devices, such as field programmable gate arrays (FPGA), a graphics processing unit (GPU), an application-specific integrated circuit (ASIC), a system on a chip (SoC), processors or other IC logic structures. At least one of the logic dies 108 functions as a controller for the memory dies 106. In the example depicted in FIG. 1, the chip package 100 is configured with at least one logic die 108 in the form of an FPGA co-packaged with a high bandwidth memory (HBM) device having at least one stack of memory dies 106, such as DRAM.

In one example, each memory die 106 includes solid state memory circuitry 114 (shown in phantom). The memory circuitry 114 of each memory die 106 comprising a stack of memory dies 106 are connected by solder connections 116, such as micro-bumps. The memory circuitry 114 may include routing that allows data transmission through the die 106 while by-passing data storage elements of the circuitry 114. The bottom memory die 106 includes contact pads 118.

The contact pads 118 are electrically coupled to the memory circuitry 114 of the memory die 106. The contact pads 118 are also electrically coupled to the high-speed interface 120, and optionally, to other circuitry (RDL) 122 within the RDL 112.

Similarly, the logic die 108 includes solid state logic circuitry 124 (shown in phantom). The logic circuitry 124 of the logic die 108 terminates at contact pads 126. The contact pads 126 are electrically coupled to the high-speed interface 120, and optionally, to the RDL circuitry 122 within the RDL 112.

The RDL circuitry 122 within the RDL 112 terminates at contact pads 128. Solder connections 130 electrically and mechanically couple the contact pads 128 of the RDL 112 to contact pads 132 of the package substrate 104.

The package substrate 104 includes package circuitry 134 that is coupled to the contact pads 132. The package circuitry 134 also terminates at contact pads 136 disposed on the opposite side of the package substrate 104.

The contact pads 136 of the package substrate 104 are electrically and mechanically coupled to contact pads 144 of the PCB 102. The contact pads 144 of the PCB 102 are coupled to PCB circuitry 140, which is routed to other packages, power sources, grounds or interfaces of the electronic device 110.

Figure 2:
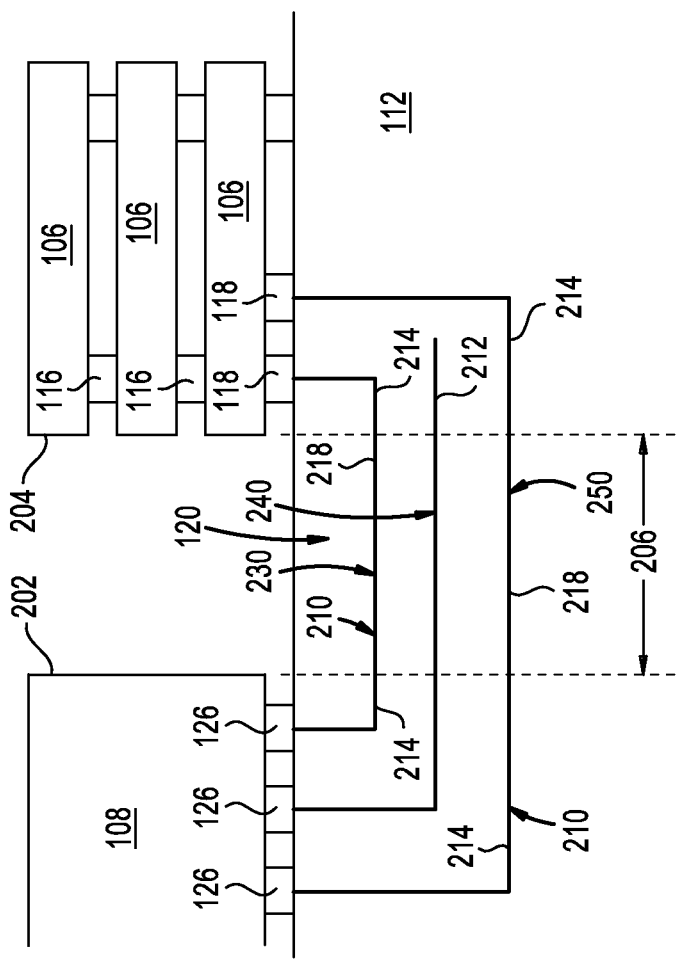
FIG. 2 is a side schematic illustration of a high speed inter-die connection interface formed in a redistribution layer and connecting dies of the chip package of FIG. 1.

FIG. 2 is a side schematic illustration of the high speed inter-die connection interface 120 formed in the RDL 112 between dies 106, 108 of the chip package 100 of FIG. 1. In FIG. 2, the logic die 108 has a side 202 that faces a side 204 of the memory dies 106. The sides 202, 204 have substantially planar surfaces (faces) that are substantially parallel. The sides 202, 204 are separated by an inter-die region 206 across which the interface 120 is disposed.

The interface 120 is generally comprises of a plurality of conductive signal transmission lines 210 that are formed between layers of dielectric material comprising the RDL 112. Examples of dielectric materials suitable for comprising the RDL 112 include $SiO_2$, $Si_3N_4$, among others. The conductive signal transmission lines 210 may be formed from copper, silver, gold, nickel, molybdenum, aluminum, indium tin oxide, copper alloys, and other conductive metal alloys, among others, depending on the selection criteria described further below. When conductive signal transmission lines 210 are formed on different layers of the RDL 112, a ground layer 212 is optionally disposed between the lines 210. The ground layer 212 may be coupled to a pad 126 of the logic die 108, or other ground of the package 100. In one example, the lines 210 have a width of 2.0 μm and a line to line pitch of 2.0 μm.

The conductive signal transmission lines 210 of the interface 120 are coupled between pads 126 of the logic die 108 and pads 118 of the memory die 106 disposed on the RDL 112. Under-die portions 214 of each conductive signal transmission line 210 reside below the dies 106, 108. Stated differently, the under-die portions 214 each conductive signal transmission line 210 do not pass through the inter-die region 206. The under-die portion 214 below the dies 106, 108 generally defines the escape fan-out of the lines 210, and includes a vertical section (e.g., a via) terminating at the pads 118, 126 and a horizontal section coupling the vertical section and an inter-die portion 218 of the line 210 that is routed though the inter-die region 206. The inter-die portion 218 of the line 210 passes across the inter-die region 206 and does not extend under dies 106, 108.

The line 210, including the inter-die portion 218 and the under-die portion 214, has average sectional area and a resistance. The resistance of the line 210 is greater than an equivalent base resistance (EBR). EBR is defined as the resistance at 25 degrees Celsius of a copper line having the same average sectional area as the line 210 having an end to end (i.e., pad 126 to pad 118) length that includes an inter-die portion defined in a direction perpendicular to the sides 202, 204 and extending across the inter-die region 206. The line 210 may be configured to have a resistance greater than the EBR in a number of ways, as further described below, including the selection of the material comprising the under-die portion 214 and/or the inter-die portion 218 of the line 210, section of a path of the inter-die portion 218 of the line 210 across the inter-die region 206, and addition of resistors, among others.

In FIG. 2, two lines 210 are illustrated on separate layers of the RDL 112, for example a first metal layer 230 and a third metal layer 250. However, the lines 210 may be alternatively distributed on any one or more layers comprising the RDL 112, for example, 3, 4, 5 or even 6 or more layers. In FIG. 2, the ground layer 212 is disposed on a second metal layer 240 disposed between the first and third metal layers 230, 250 to provide shielding between the lines 210 residing in the first and third metal layers 230, 250. In one example of an interface 120 having multiple layers of the RDL 112 utilized for the routing of the signal transmission lines 210, the lines 210 comprising each channel may be disposed on separate layers, for example, a first channel having all its transmission lines 210 routed in the first layer 230 and a second channel having all its transmission lines 210 routed in the third layer 250.

Figure 3:
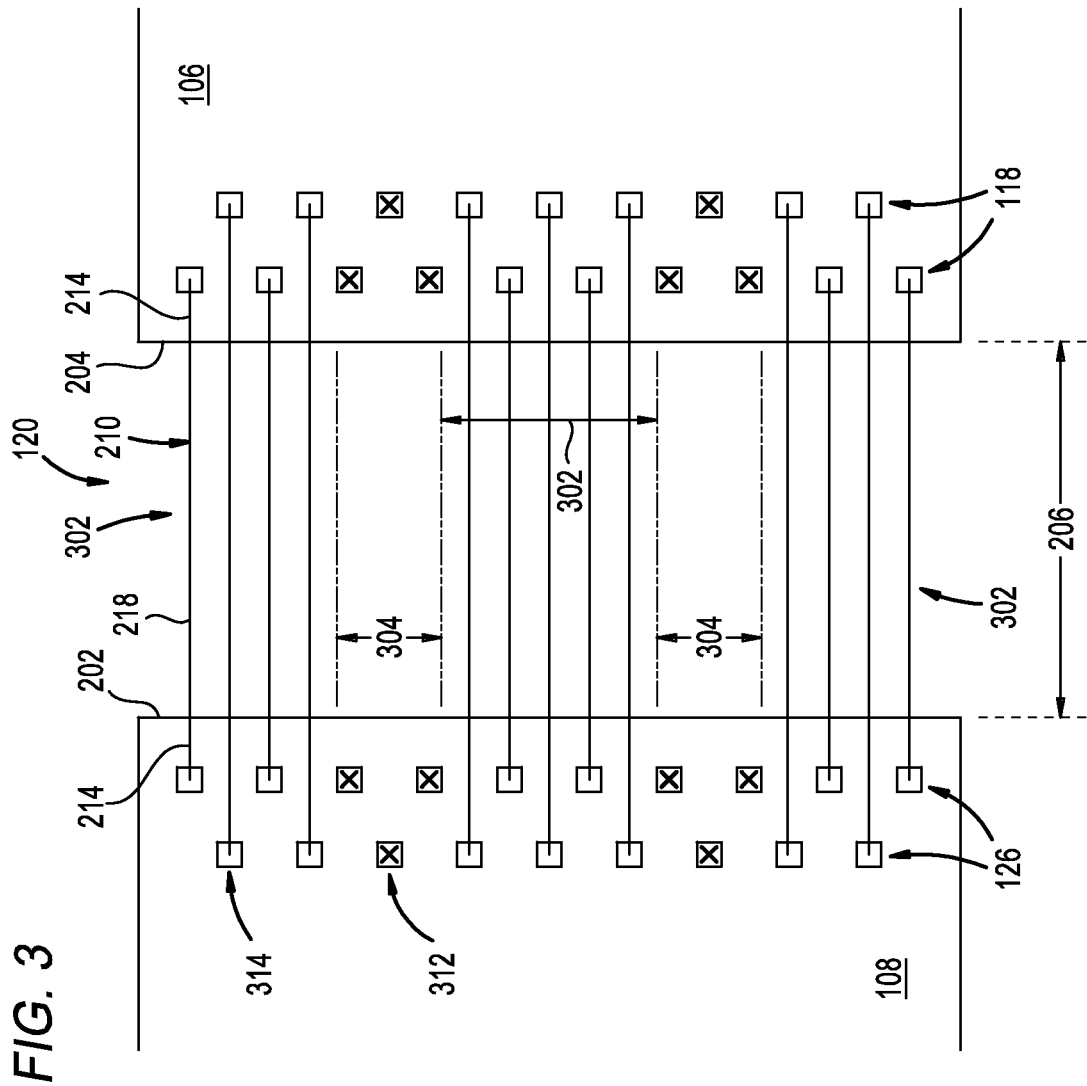
FIGS. 3-5 are top schematic views of different examples of an inter-die connection interface formed in a redistribution layer and connecting dies of a chip package.
Figure 4:
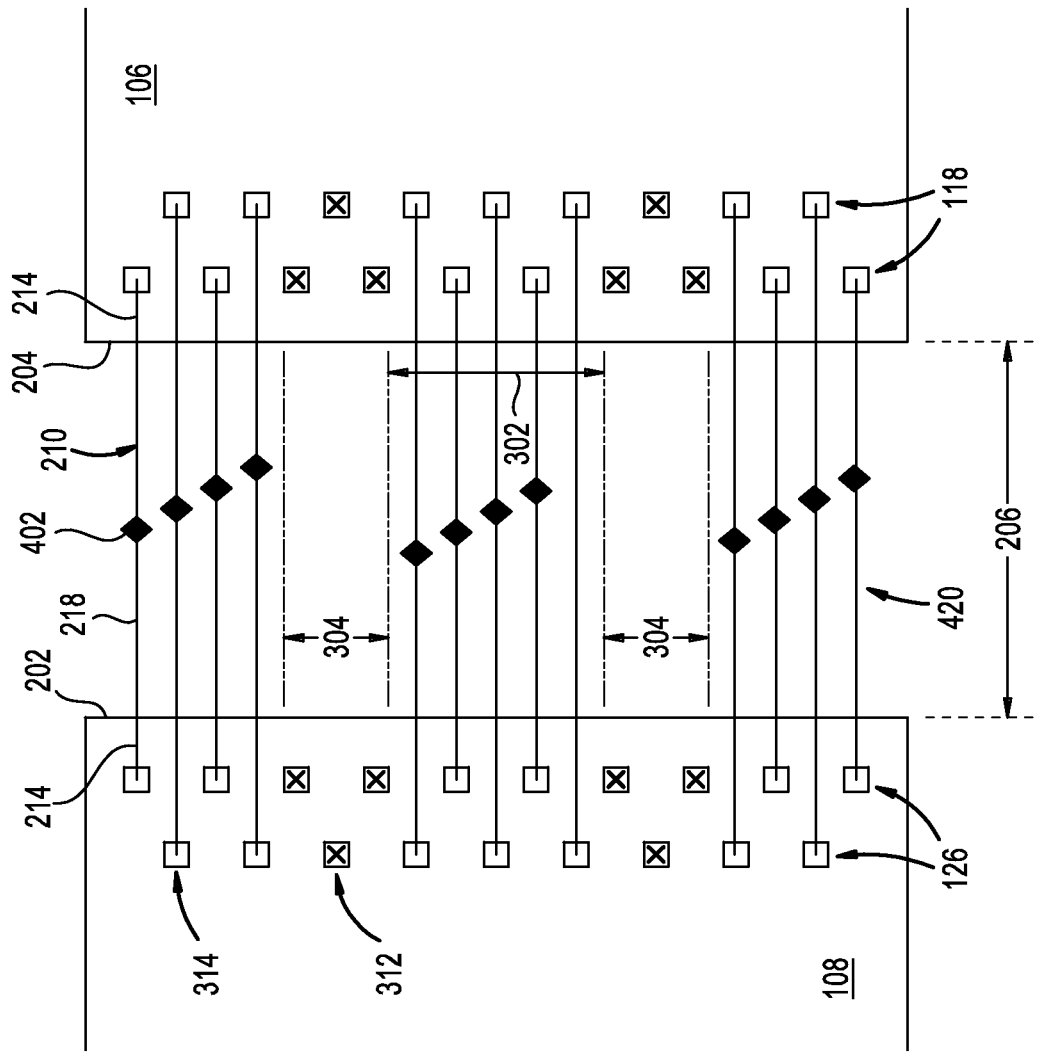
Figure 5:
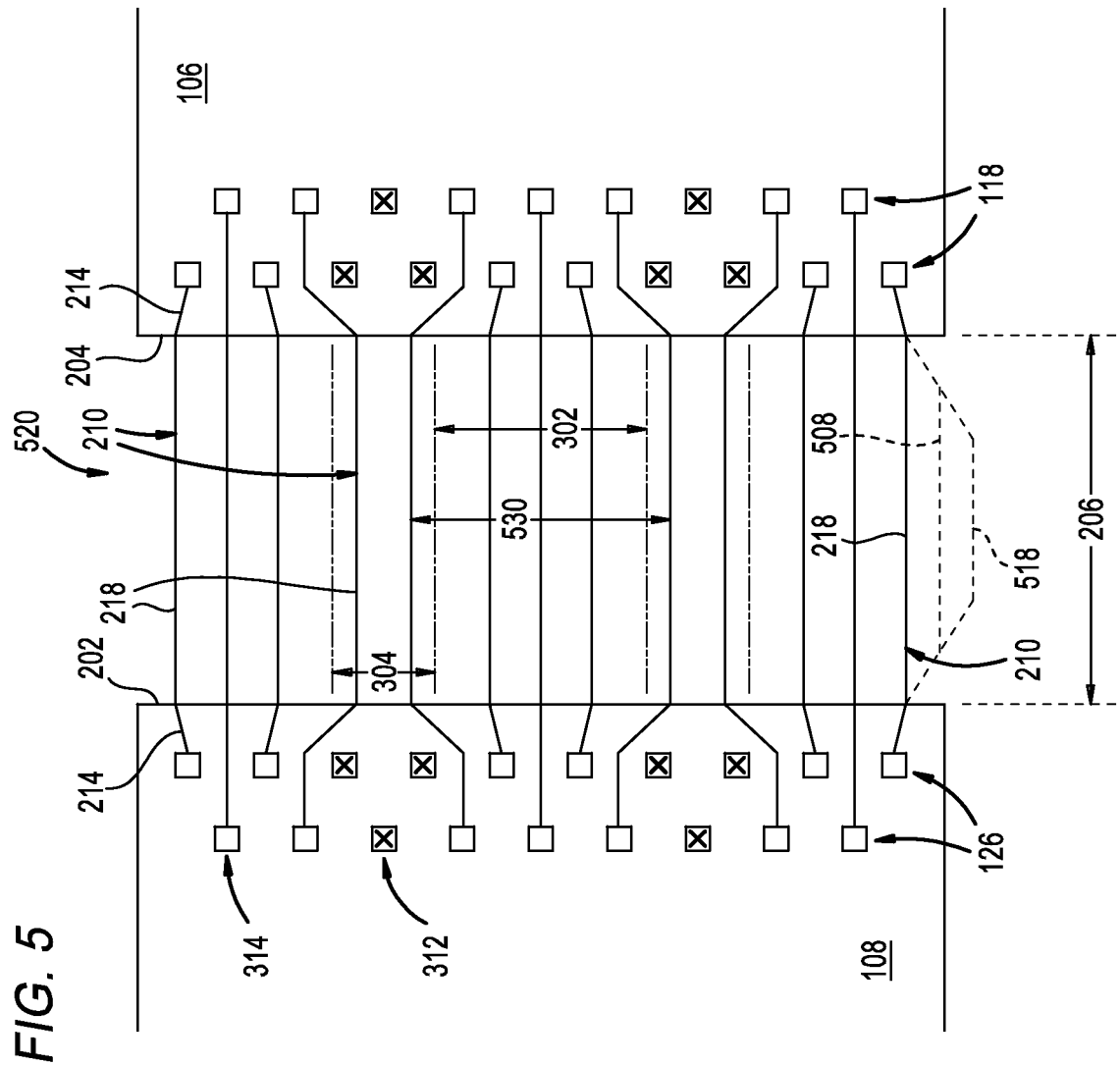

FIGS. 3-5 are top schematic views of different examples of an inter-die connection interface formed in a redistribution layer between dies of a chip package. Turning first to the example depicted in FIG. 3, a number of contact pads 126 are illustrated along an edge of the side 202 of the logic die 108 that faces the memory die 108. The number of contact pads 126 shown in FIG. 3 are for illustrative purposes only, as actual implementations will differ, generally having many more pads 216 distributed in multiple rows. Some of the contact pads 126 contain an "X" and are identified with reference numeral 312 to signify that the contact pad 312 is for one of ground or power. The contact pads 126 which do not contain an "X" are identified with reference numeral 314 to identify that pads 314 are for signal transmission. Groups of signal transmission pads 314 are generally separated by one or more ground or power pads 312 at the edge of the side 202. One or more groups of signal transmission pads 314 are configured to service a channel the logic circuitry 124, for example, as a group of 32 pads comprising a 32-bit channel.

The inter-die region 206 may be parsed into different regions corresponding to the presence the ground or power pads 312, and the presence of signal transmission pads 314. For example, the region of the inter-die region 206 extending between the ground or power pads 312 of the logic die 108 and the ground or power pads 118 (designated by the "X") of the memory die 106 defines a first region 302. Similarly, the region of the inter-die region 206 extending between the transmission pads 314 of the logic die 108 and the contact pads 118 (designated by not having an "X") of the memory die 106 defines a second region 304. The number of regions 302, 304 may vary dependent on the layout of the pads 312, 314.

In the example depicted in FIG. 3, the inter-die portion 218 of each line 210 remains in the first region 302 associated with the transmission pad 314 from which the 210 originates, generally extending across the inter-die region 206 in a linear path that is perpendicular to the side 202 of the logic die 108. Thus, the inter-die portions 218 of the lines 210 do not cross into the second region 304.

As discussed above, the line 210 has a resistance greater than the EBR of a copper line having the same average sectional area as the line 210 and an end to end (i.e., pad 126 to pad 118) length that includes an inter-die portion defined in a direction perpendicular to the sides 202, 204 and extending across the inter-die region 206. In some examples, only the inter-die portion of the line 210 has a resistance greater than the EBR. To achieve this resistance, the material of the under-die portion 214, the inter-die portion 218 or the entire line 210 is selected to have a resistance greater than copper. Thus, suitable materials for the line 210 exclude pure copper and silver, and include gold, nickel, molybdenum, aluminum, and indium tin oxide, among others. Alloys of copper, and other metal alloys, that have a resistivity greater than pure copper may also be utilized.

The increased resistance of the line 210 compared to convention signal bus lines (i.e., lines having a resistance equal to the EBR) advantageously dampens the oscillation caused by switching within adjacent lines. Thus, the performance of the interface 120 is more robust and reliable, thereby improving the performance of the chip package 100, and ultimately, the electronic device 110.

FIG. 4 is a top schematic view of another configuration of the inter-die connection interface 420 that may be formed in the RDL 112 between dies 106, 108 of the chip package 100. The interface 420 is configured essentially the same of the interface 120 described above, except wherein the resistance of the lines 210 is greater than the EBR of a copper line having the same average sectional area as the line 210 and having an end to end (i.e., pad 126 to pad 118) length that includes an inter-die portion defined in a direction perpendicular to the sides 202, 204 and extending across the inter-die region 206 by inclusion of one or more resistors 402 disposed in series with the line 210. Although the resistor 402 is shown interfaced with the inter-die portion 218 of the line 210, the resistor 402 may be alternatively interfaced with the under-die portion 214 of the line 210, or at the interface between the under-die and inter-die portions 214, 218 of the line 210.

The resistor 402 may be point resistor, or other suitable resistor. A point resistor is generally a material disposed in series with the line 210 that has a resistivity greater than that of the material comprising the line 210. For example, the line 210 may be fabricated from copper while the point resistor 402 may fabricated from molybdenum.

The lines 210 of the interface 420 illustrated in FIG. 3 generally remain in the first region 302. Additionally, although not required, the inter-die portion 218 of the lines 210 generally extend across the inter-die region 206 in a linear path that is perpendicular to the side 202 of the logic die 108.

FIG. 5 is a top schematic view of another configuration of the inter-die connection interface 520 that may be formed in the RDL 112 between dies 106, 108 of the chip package 100. The interface 520 is configured essentially the same of the interface 120 described above, except wherein the some of the lines 210 have inter-die portions 218 that are completely, or at least partially, disposed within the second region 304.

For example as illustrated in FIG. 5, at least the lines 210 originating from transmission pads 314 closest to the power or ground pads 312 jog laterally (i.e., in a direction parallel to the face of the side 202) so that at least some or all of the inter-die portion 218 of the line 210 extends into the second region 304. As a result, the inter-die portion 218 of the line 210 have greater spacing, advantageously reducing the probability of crosstalk between lines 210.

The greater spacing is best illustrated by the examining the transmission lines 210 that originate from transmission pads 314 that are bounding by power or ground pads 312. A distance 530 defined between the transmission pads 314 closest power or ground pads 312 is significantly greater than a distance across the first region 302. The distance 530, being larger than the width of the first region 302, allows the spacing between lines 210 comprising this portion of the interface 520 to be much farther apart relative to other configurations or conventional interfaces that utilize linear lines extending exclusively through the first region 302.

In some examples, the lines 210 closes a side 510 of the logic die 208 may also extend beyond the side 510 of the logic die 208 to effectively increase the width of the region 302 adjacent the side 510 of the logic die 208. For example, the side 510 of the logic die 208 is shown projected across the inter-die region 206 by imaginary line 508. The inter-die portion 218 of the line 210, illustrated in phantom by reference numeral 518, is shown disposed outward of the imaginary line 508, and thus outward of the side 510 of the logic die 208 to effectively increase the width of the first region 302 at the side 510 of the logic die 208, and accordingly allow greater spacing between the lines 210.

The inter-die portions 218 of the lines 210 comprising of the interface 520 illustrated in FIG. 5 are generally illustrated extending across the inter-die region 206 in a linear path that is perpendicular to the side 202 of the logic die 108. However, the inter-die portions 218 of the lines 210 comprising of the interface 520 may alternatively be non-linear as to increase the effective length, and thus resistance, of the inter-die portions 218. In some embodiments, the increased spacing of the lines 210 comprising the interface 520 provides sufficient improvement in crosstalk so that increasing the resistance of the inter-die portions 218 above EBR may be omitted in applications where the amount of oscillation is acceptable. In other examples, the overall resistance of the line 210 may be achieved by the extra length of the provided by the under-die portions 214 of the line 210 needed to effectively jog the inter-die portions 218 of the lines 210 laterally apart.

In one example, the line 210 has a resistance greater than the EBR of a copper line having the same average sectional area as the line 210 and having an end to end (i.e., pad 126 to pad 118) length that includes an inter-die portion defined in a direction perpendicular to the sides 202, 204 and extending across the inter-die region 206. The greater than the EBR resistance may be achieved by utilizing a resistor, such as the resistor 402 illustrated in FIG. 4, or by selecting a material of the inter-die portion 218 of the line 210 that as a resistance greater than copper. Suitable materials for the line 210 have been discussed above with reference to FIG. 3.

In another example, a portion or all of the line 210 may be made of copper or other conductive material suitable for use as a signal transmission line, except wherein the length of the inter-die portion 218 of the line 210 is greater than the distance (from side 202 to side 204) across the inter-die region 206. The under-die portion 214 and/or inter-die portion 218 of the line 210 may be made longer by utilizing a non-linear path across the inter-die region 206, as further discussed below.

FIGS. 6-9 are schematic views of different examples of inter-die portions of the signal transmission line 210 of an inter-die connection interface. The inter-die connection interface may be any of the inter-die connection interfaces described herein. Any of the signal transmission line 210 described with reference to FIGS. 6-9 may incorporate resistors, such as the resistor 402 described in reference to FIG. 4. Alternatively, or in addition to, any of the signal transmission line 210 described with reference to FIGS. 6-9 may have portions residing within the second region 304, as described in reference to FIG. 5.

Figure 6:
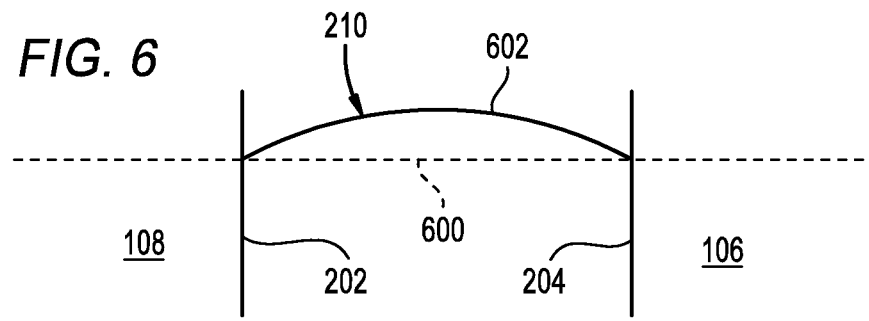
FIGS. 6-9 are schematic views of different examples of a portion of line of an inter-die connection interface.

Turning now to FIG. 6, FIG. 6 illustrates an inter-die portion 602 of a transmission line 210 extending across an inter-die region 206 defined between a logic die 108 and memory die 106. A linear path, illustrated by imaginary line 600, is shown extending perpendicularly between the sides 202, 204 of the dies 106, 108. The inter-die portion 602 of the signal transmission line 210 is non-linear, and thus, longer than a transmission line that is co-linear with the imaginary line 600. Accordingly, the resistance of the inter-die portion 602 of the signal transmission line 210 is greater than the EBR even in examples wherein the inter-die portion 602 is fabricated from copper, which effectively reduces undesirable oscillations within the lines 210.

In the example depicted in FIG. 6, the inter-die portion 602 of the signal transmission line 210 is curved. For example, the inter-die portion 602 of the signal transmission line 210 is arced shaped, for example, residing on a single side of the imaginary line 600. It is contemplated that other non-linear shapes may be utilized. It is also contemplated that some or all of the under-die portion 214 of the line 210 may also be curved.

Figure 7:
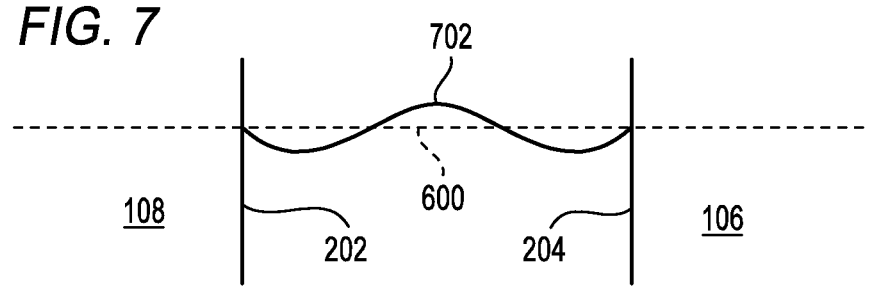

FIG. 7 illustrates another inter-die portion 702 of a transmission line 210 extending across an inter-die region 206 defined between a logic die 108 and memory die 106. Imaginary line 600 is shown extending perpendicularly between the sides 202, 204 of the dies 106, 108. The inter-die portion 702 of the signal transmission line 210 is also non-linear, and thus, longer than a transmission line that is co-linear with the imaginary line 600. However, unlike the inter-die portion 602 of the signal transmission line 210 of FIG. 6, the inter-die portion 702 of the signal transmission line 210 depicted in FIG. 7 has a path that extends on both sides of the imaginary line 600.

In one example, the inter-die portion 702 of the signal transmission line 210 is has a smooth waveform, such as a sinusoidal waveform. The sinusoidal waveform has a wavelength of less than twice the distance across the inter-die region 206 defined between the dies 106, 108. In other examples, the inter-die portion 702 of the signal transmission line 210 has a wavelength equal to or less than distance across the inter-die region 206. It is also contemplated that some or all of the under-die portion 214 of the line 210 may also have a smooth waveform.

Accordingly, the resistance of the inter-die portion 702 of the signal transmission line 210 is greater than the EBR even in examples wherein the inter-die portion 702 is fabricated from copper, which effectively reduces undesirable oscillations within the lines 210.

Figure 8:
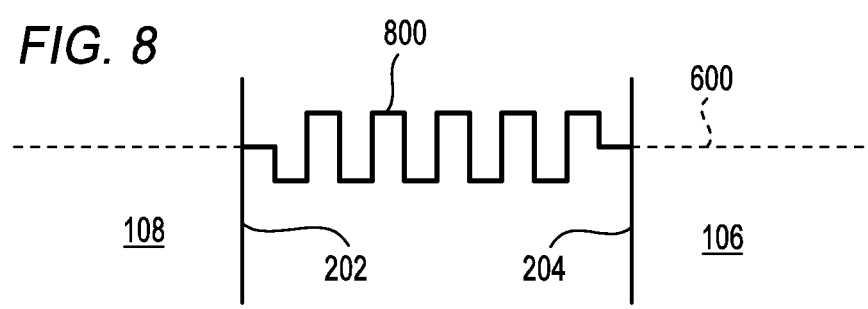
Figure 9:
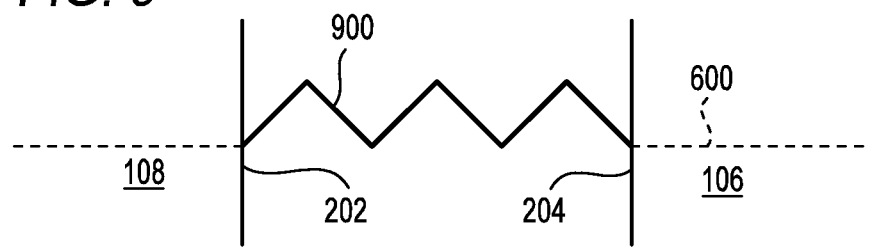

FIGS. 8-9 illustrates inter-die portions 800, 900 of transmission lines 210 extending across an inter-die region 206 defined between a logic die 108 and memory die 106. Imaginary line 600 is shown extending perpendicularly between the sides 202, 204 of the dies 106, 108. The inter-die portions 800, 900 of the signal transmission line 210 is also non-linear, and thus, longer than a transmission line that is co-linear with the imaginary line 600. However, unlike the inter-die portion 602 of the signal transmission line 210 of FIG. 6 and similar to the inter-die portion 702 of the signal transmission line 210 of FIG. 7, the inter-die portions 800, 900 of the signal transmission lines 210 depicted in FIGS. 8-9 has a path that extends on both sides of the imaginary line 600.

In the example depicted in FIG. 8, the inter-die portion 800 of the signal transmission line 210 is has a step waveform, such as a square waveform. In the example depicted in FIG. 9, the inter-die portion 900 of the signal transmission line 210 is has a zig-zag or sawtooth waveform. The step and sawtooth waveforms have a wavelength of less than twice the distance across the inter-die region 206 defined between the dies 106, 108. In other examples. In other examples, the inter-die portions 800, 900 of the signal transmission lines 210 have a period wavelength equal to or less than distance across the inter-die region 206. It is also contemplated that some or all of the under-die portion 214 of the line 210 may also have a step or sawtooth waveforms.

Accordingly, the resistance of the inter-die portion 800, 900 of the signal transmission line 210 is greater than the EBR even in examples wherein the inter-die portion 800, 900 is fabricated from copper, which effectively reduces undesirable oscillations within the lines 210.

Figure 10:
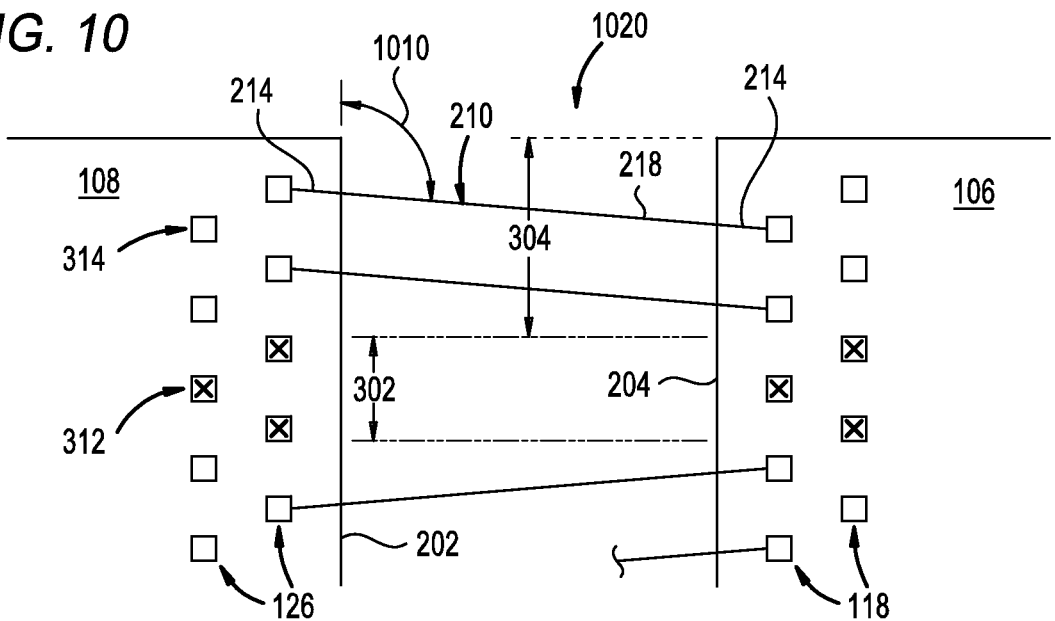
FIGS. 10-11 are top schematic views of another example of an inter-die connection interface formed in different layers of a redistribution layer connecting dies of a chip package.
Figure 11:
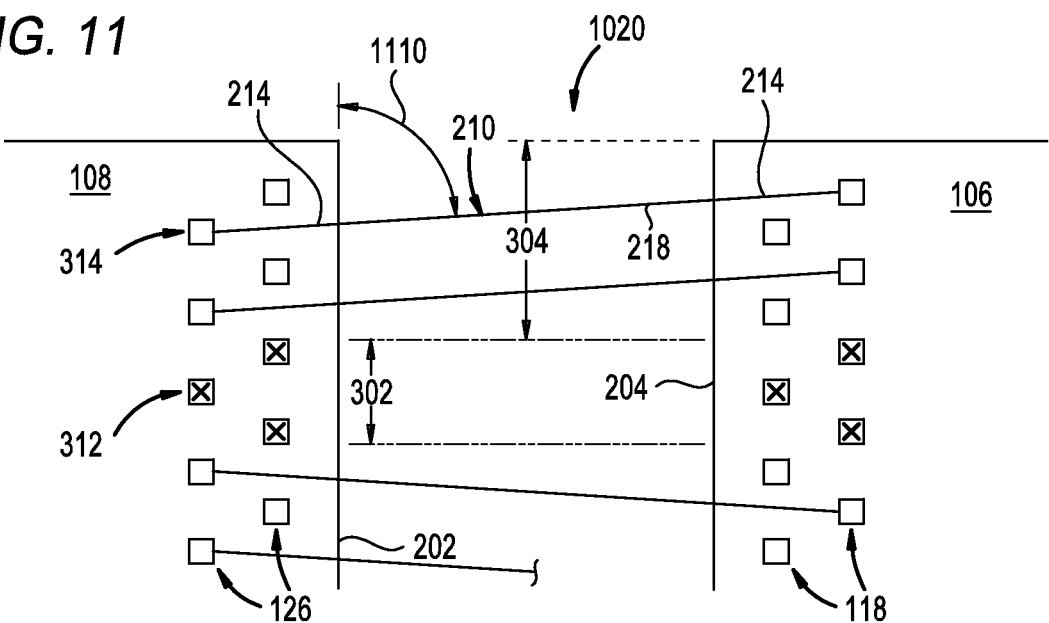

FIGS. 10-11 are top schematic views of another example of an inter-die connection interface 1020 formed in different layers of an RDL 112 disposed between dies 106, 108 of a chip package 100. Signal transmission lines 210 are disposed in a first layer of the RDL 112, such as the first layer 230 depicted in FIG. 2, is illustrated in FIG. 10, while transmission lines 210 are disposed in another layer of the RDL 112, such as the third layer 250 depicted in FIG. 2.

Referring now to FIG. 10, the signal transmission lines 210 are disposed at a non-orthogonal angle 1010 relative to the face of the side 202 of the logic die 108. Thus, the inter-die portion 218 of the line 210 that is routed though the inter-die region 206 has a length greater, and consequently more resistance, than a similar line routed perpendicularly across the inter-die region 206. Accordingly, the inter-die portions 218 of the lines 210 have a resistance that is greater than the EBR of a copper line having the same average sectional area as the line 210 having an end to end length that includes an inter-die portion defined in a direction perpendicular to the sides 202, 204 and extending across the inter-die region 206.

The inter-die portion 218 of the line 210 may have a linear or non-linear path across the inter-die region 206. Some examples of non-linear paths are illustrated in FIGS. 6-9. The inter-die portion 218 or other portion of the line 210 may optionally include a resistor, such as the resistor 402 depicted in FIG. 4. The conductive signal transmission lines 210 may be formed from copper, silver, gold, nickel, molybdenum, aluminum, indium tin oxide, copper alloys, and other conductive metal alloys, among others.

The farther the angle 1010 is from 90 degrees, the longer, and thus more resistive, the lines 210 will be. However, the farther the angle 1010 is from 90 degrees, the closer, and thus more susceptible to crosstalk, the lines 210 will be. To improve the prevention of crosstalk, some of the signal transmission lines 210 of the interface 1020 may be disposed on a different layer, such as shown in FIG. 11. In FIG. 11, the signal transmission lines 210 are disposed at a non-orthogonal angle 1110 relative to the face of the side 202 of the logic die 108. Thus, by spreading the lines 210 across different layers of the RDL 112, the number of lines 210 per layer is reduces, which allows greater spacing of the lines 210 formed in each layer. The greater spacing of the lines 210 formed in each layer allows for enhanced resistance to crosstalk. In one example, all the lines 210 for a first channel are formed in the first layer of the RDL 112 illustrated in FIG. 10, while all the lines 210 for a second channel are formed in a different layer of the RDL 112 illustrated in FIG. 11.

FIG. 12 is a flow diagram of a method 1200 of fabricating a chip package, such as the chip package 100 described above. The method 1200 begins at operation 1202 by mounting one or more logic dies 108 and one or more stacks of memory dies 106 on a carrier. At operation 1204, the dies 106, 108 are encased in a molding compound 142 to maintain the positional orientation and spacing of the dies 106, 108. At operation 1206, the carrier is removed to expose the pads 118, 126 of the dies 106, 108.

At operation 1208, a redistribution layer, such as the RDL 112, is formed below and in contact with the exposed pads 118, 126 the dies 106, 108. The redistribution layer 112 includes a high-speed signal transmission interface, such as the interfaces 120, 420, 520, 1020 described above, or other interface having another suitable configuration. The signal transmission lines 210 of the signal transmission interface are configured to have a resistance greater than an EBR. For example, the redistribution layer 112 may be formed from lines 210 fabricated from materials having a resistivity greater than that of copper. In another example, the lines 210 of the redistribution layer 112 may include a resistor 402. In another example, the lines 210 of the redistribution layer 112 may jog laterally such that the inter-die portion 218 of the line 210 that is routed though the inter-die region 206 is disposed through a region defined across the inter-die region 206 that is located in front of a ground or power pad. In yet another example, the lines 210 of the redistribution layer 112 may have a non-linear path, such as but not limited to as illustrated and described with reference to FIGS. 6-9. In still another example, the lines 210 of the redistribution layer 112 may have path defined across the inter-die region 206 that is oriented at a non-orthogonal angle relative to the face of the side 202 of the logic die 108.

At operation 1210, the RDL 112 is electrically and mechanically mounted to a package substrate 104, thus connecting the package circuitry 134 to the circuitry 124, 114 of the dies 106, 108. The package substrate 104 with mounted dies 106, 108 form the chip package 100. In one example, the chip package 100 is configured as a HBM device having one or more stacks of memory dies 106 co-packaged with a controller residing on the logic die 108.

At operation 1212, the package substrate 104 is electrically and mechanically mounted to a printed circuit board 102, thus connecting the PCB circuitry 140 to the circuitry 124, 114 of the dies 106, 108 and forming the chip package 100.

Thus, a chip package having an improved high speed inter-die connection interface has been described. The high speed inter-die connection interface is configured to dampen oscillations which advantageously improves noise margin, quiet switching, signal transmission quality and performance reliability. In some examples, signal transmission lines of the inter-die connection interface are spaced in a manner that advantageously reduces crosstalk.

While the foregoing is directed to embodiments of the present disclosure, other and further embodiments may be devised without departing from the basic scope thereof, and the scope thereof is determined by the claims that follow.

What is claimed is:

1. A chip package comprising:
 a first die;
 a second die;
 a package substrate; and
 an redistribution layer (RDL) mounted on the package substrate on a first side of the RDL, the first die and the second die mounted on the RDL on a second side of the RDL opposite the first side, the first die and the second die disposed laterally to each other, the RDL comprising an inter-die region defined between facing sides of the first and second dies, the RDL having a signal transmission interface connecting the second die with the first die, the signal transmission interface comprising:
 a signal transmission line having an inter-die portion, the inter-die portion passing through the inter-die region, the signal transmission line having a resistance greater than an equivalent base resistance (EBR) of a copper line and having physically non-linear path defined across the inter-die region defined between first and second dies, the physically non-linear path disposed along a plane parallel to the package substrate, the signal transmission line comprising a resistive element in the inter-die region of the RDL.

2. The chip package of claim 1, wherein the inter-die portion of the signal transmission line comprises a copper alloy portion defined across the inter-die region defined between first and second dies.

3. The chip package of claim 1, wherein the signal transmission line has a resistivity greater than a resistivity of copper.

4. The chip package of claim 1 wherein:
 the inter-die region defined between facing sides of the first and second dies, the inter-die region comprising:
 a first region extending between the first and second dies adjacent signal transmission pads formed at the side of the second die; and
 a second region extending between the first and second dies adjacent ground or power pads formed at the side of the second die, the signal transmission line disposed at least partially within the second region.

5. The chip package of claim 4, wherein the inter-die portion of the signal transmission line has a non-linear path defined across an inter-die region defined between first and second dies.

6. The chip package of claim 4, wherein the signal transmission line has a resistivity greater than a resistivity of copper.

7. The chip package of claim 1, wherein the inter-die portion of the signal transmission line is disposed at a non-orthogonal angle to a side of the second die facing the first die.

8. The chip package of claim 7, wherein the inter-die portion of the signal transmission line has a non-linear path defined across an inter-die region defined between first and second dies.

9. The chip package of claim 7, wherein the signal transmission line has a resistivity greater than a resistivity of copper.

10. The chip package of claim 7, wherein the signal transmission line is part of a first group of signal transmission lines formed on at least two metal layers comprising the interface.

11. The chip package of claim 7, wherein the signal transmission line is part of a first group of signal transmission lines defining a first channel, the first group of signal transmission lines formed on a first metal layer;
 and wherein a second group of signal transmission lines defining a second channel are formed in the interface on a second metal layer that is below the first metal layer.

12. A chip package comprising:
 a first die;
 a second die;
 a package substrate;
 an inter-die region defined between the first die and the second die, the inter-die region defined between facing sides of the first die and the second die; and
 a redistribution layer (RDL) mounted on the package substrate on a first side of the RDL, the first die and the second die mounted on the RDL on a second side of the RDL opposite the first side, the first side and the second side disposed parallel to a top surface of the package substrate, the first die and the second die disposed laterally to each other on the RDL, the RDL having a signal transmission interface connecting the first die with the second die, the signal transmission interface comprising:

a first signal transmission line having an inter-die portion, the first signal transmission line having a resistance greater than an equivalent base resistance (EBR) of a copper line, the first signal transmission line comprising a resistive element in the RDL, wherein the resistive element is disposed in the inter-die region and along the inter-die portion of the signal transmission line.

13. The chip package of claim 12, wherein the inter-die portion of the first signal transmission line has a physically non-linear path defined across the inter-die region defined between the first and second dies, the physically non-linear path disposed along a plane parallel to the package substrate.

14. The chip package of claim 12, wherein the first signal transmission line has a resistivity greater than a resistivity of copper.

15. The chip package of claim 12, wherein the interface further comprises:
a second signal transmission line having an inter-die portion, the inter-die portion of the first signal transmission line and the inter-die portion of the second signal transmission line disposed on different layers of the interface.

16. A chip package comprising:
a first die;
a second die;
a package substrate;
an redistribution layer (RDL) mounted on the package substrate on a first side of the RDL, the first die and the second die mounted on the RDL on a second side of the RDL opposite the first side, the first die and the second die disposed laterally to each other, the RDL having a signal transmission interface connecting the second die with the first die, the signal transmission interface comprising:
a signal transmission line having an inter-die portion, the signal transmission line having a resistance greater than an equivalent base resistance (EBR) of a copper line and having and having a linear path between the first and second dies, the signal transmission line comprising a resistive element in an inter-die region of the RDL, wherein the linear path is disposed along a plane parallel to the package substrate and is diagonally between lateral sides of the first and second dies,
wherein the RDL comprises the inter-die region defined between facing sides of the first and second dies, the inter-die portion passing through the inter-die region.

17. A chip package comprising:
a first die;
a second die;
a package substrate;
an redistribution layer (RDL) mounted on the package substrate on a first side of the RDL, the first die and the second die mounted on the RDL on a second side of the RDL opposite the first side, the first die and the second die disposed laterally to each other, the RDL having a signal transmission interface connecting the second die with the first die, the signal transmission interface comprising:
a copper signal transmission line having an inter-die portion defined between the first and second dies, the inter-die portion of the copper signal transmission line having a resistance greater than an equivalent base resistance (EBR) of a copper line, the copper signal transmission line comprising a resistive element in an inter-die region of the RDL;
wherein the RDL comprises the inter-die region defined between facing sides of the first and second dies, the inter-die portion passing through the inter-die region.

* * * * *